United States Patent [19]

Savage et al.

[11] Patent Number: 5,120,590
[45] Date of Patent: Jun. 9, 1992

[54] PROTECTED CONDUCTIVE FOIL AND PROCEDURE FOR PROTECTING AN ELECTRODEPOSITED METALLIC FOIL DURING FURTHER PROCESSING

[75] Inventors: Rolland D. Savage, Mentor, Ohio; John P. Callahan, Irvine, Calif.

[73] Assignee: Gould Inc., Eastlake, Ohio

[21] Appl. No.: 636,018

[22] Filed: Jan. 4, 1991

Related U.S. Application Data

[63] Continuation of Ser. No. 347,841, May 5, 1989, abandoned.

[51] Int. Cl.⁵ .............................................. B32B 3/02
[52] U.S. Cl. ..................................... 428/76; 428/192;
    428/198; 428/457; 428/461; 428/480; 428/516;
    428/212; 428/332; 428/334; 428/335; 428/40;
    428/42; 428/901; 428/906; 156/148; 156/150;
    156/233; 156/275.1
[58] Field of Search ................. 428/76, 192, 198, 457,
    428/461, 480, 516, 212, 906, 901, 332, 334, 335,
    40, 42; 156/60, 148, 150, 233, 275.1

[56] References Cited

U.S. PATENT DOCUMENTS

| | | | |
|---|---|---|---|
| 2,350,247 | 10/1967 | Steinberg | 156/1 |
| 2,668,348 | 2/1954 | Hubbell | 428/198 |
| 2,706,165 | 4/1955 | Korsgaard | 154/126.5 |
| 2,864,755 | 12/1958 | Rothacker | 204/165 |
| 3,589,975 | 6/1971 | Andrews | 161/165 |
| 3,647,592 | 3/1972 | Woodberry | 156/285 |
| 3,755,043 | 8/1973 | Igarashi | 156/272 |
| 4,022,648 | 5/1977 | Woodberry | 156/273 |
| 4,179,324 | 12/1979 | Kirkpatrick | 156/230 |
| 4,446,188 | 5/1984 | Patel | 428/138 |

FOREIGN PATENT DOCUMENTS 0006232 2/1985 Japan .................................. 428/76

OTHER PUBLICATIONS

DuPont Trade Bulletitn, Mylar 920B, High-Performance Films Division Nov. 1986.

Primary Examiner—Patrick J. Ryan
Attorney, Agent, or Firm—Benner, Otto, Boisselle & Sklar

[57] ABSTRACT

A conductive copper foil for use in preparing printed circuit boards is protected from damage during storage, shipment and further processing by covering one side of the foil with a sheet of polyethylene film. The film is removably joined with the foil by an adhesive material placed between the film and the foil in a marginal area of the latter. The film is selected to be sufficiently resistant to laminating temperature and pressure conditions so as to remain in its covering, protecting relationship to the foil and avoid sticking to the laminating press plate and retain its removability from the foil after lamination.

58 Claims, 2 Drawing Sheets

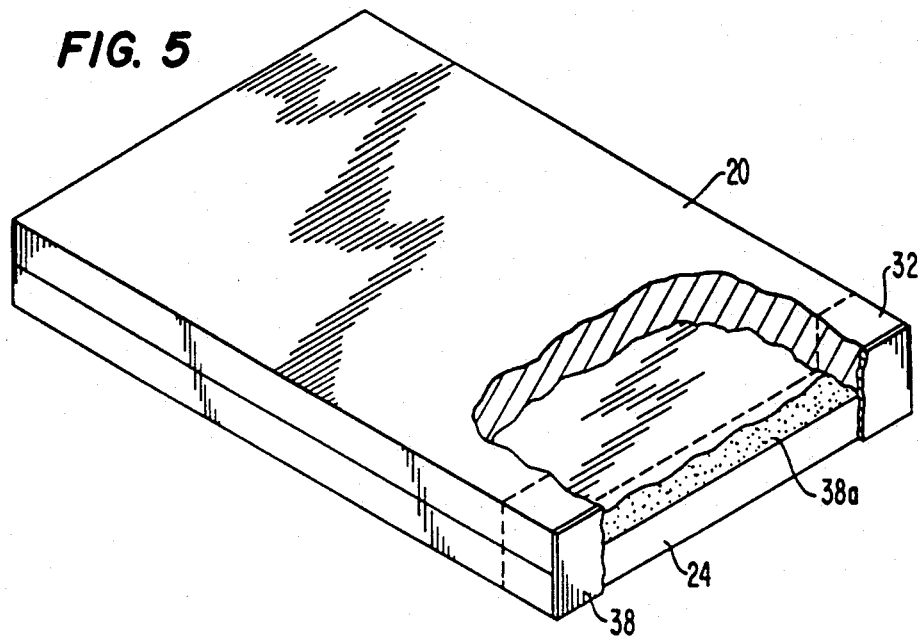
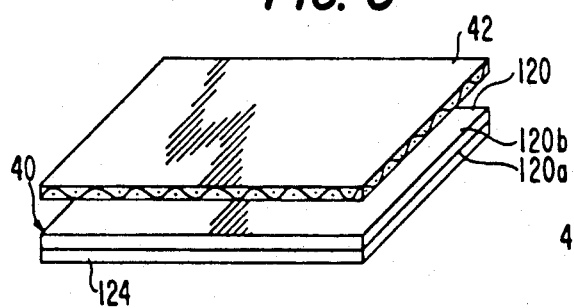
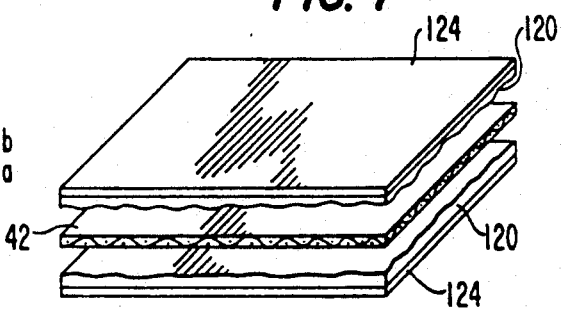
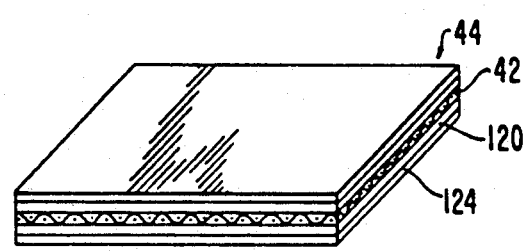
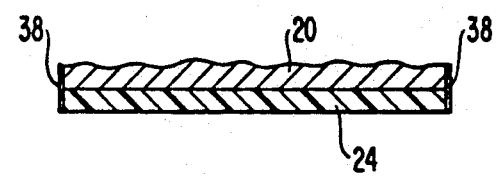

PROTECTED CONDUCTIVE FOIL AND PROCEDURE FOR PROTECTING AN ELECTRODEPOSITED METALLIC FOIL DURING FURTHER PROCESSING

This is a continuation of copending application Ser. No. 07/347,841, filed on May 5, 1989, now abandoned.

BACKGROUND OF THE INVENTION

1. Field of the Invention

The present invention relates to etchable conductive foils useful in preparing printed circuit boards and particularly to a means and a method for protecting such foils from damage during the handling and further processing of the foil leading up to the etching procedures whereby the foil is converted into the lines and other components making up the conductive pathways for printed circuit board circuitry.

2. Description of the Prior Art

Printed circuit components have become widely used in a variety of applications for radios, televisions, computers, etc. Of particular interest are multi-layer printed circuit board laminates which have been developed to meet the demand for miniaturization of electronic components and the need for printed circuit boards having a high density of electrical interconnections and circuitry. In the manufacture of printed circuit boards, raw materials, including conductive foils, which are usually copper foils, and dielectric supports comprising organic resins and suitable reinforcements, are packaged together and processed under temperature and pressure conditions to produce products known as laminates. The laminates are then used in the manufacture of printed circuit board components. In this endeavor the laminates are processed by etching away portions of the conductive foil from the laminate surface to leave a distinct pattern of conductive lines and formed elements on the surface of the etched laminate. Further laminates and/or laminate materials may then be packaged together with the etched product to form a multi-layer circuit board package. Additional processing, such as hole drilling and component attaching, will eventually complete the printed circuit board product. As printed circuit board technology has advanced to provide higher density boards with smaller printed circuit lines, surface contamination of the raw material products has become a significant problem which generally cannot be tolerated in a successful commercial application.

Although many of the printed circuit board manufacturing and handling procedures are potential sources of surface contamination, one significant problem area involves the construction and lamination procedures by which the laminated products are prepared. Generally speaking, in this connection, the construction of the laminates involves stacking (or lay-up) of conductive foil pieces and dielectric substrates (prepregs) which will then be bonded to one another in a laminating press. Residual particles, particularly those emanating from the prepreg raw materials, are known to be present in the lay-up room environment as a result of the handling of such materials. Eventually these particles may contaminate the surfaces of the conductive foil pieces bonded to the laminates.

Presently such contamination problems are dealt with by attempting to maintain a clean environment in the lay-up area by air filtration, intensified housekeeping techniques, etc. Additionally, the conductive foil surfaces of laminates may often simply be spot cleaned. However, spot cleaning is not necessarily an acceptable procedure for laminates clad with so-called double-treated, electrodeposited copper foils. Double-treated copper foils are those which have been treated on both the matte side and the shiny (drum) side for enhanced bonding ability and improved peel strength when bound to a prepreg. In this regard, it should be noted that while double-treated copper foils are theoretically more desirable than single-treated foils for preparing multi-layer laminates, because such prior treatment enables the elimination of the chemical oxide roughening step, i.e., black oxide, that is otherwise required to enhance bonding and peel strength of the shiny side of the lines after etching, double-treated copper foils cannot be subjected to spot cleaning for removal of contamination because such cleaning would also remove the treatment and prevent, or at least interfere with, subsequent bonding of the conductive lines to another prepreg during fabrication of a multiple layer laminate.

Thus, in the past, surface contamination has been a major economical disadvantage in the production of printed circuit boards, and particularly in the production of multiple layer printed circuit board products having high component densities. Moreover, even through the use of such measures as the environmental control of the lay-up room area, those involved in the manufacture of printed circuit boards have not been able to achieve acceptable prevention of surface contamination without incurring major costs and losses of efficiency in manufacturing procedures. Spot cleaning of laminate surfaces is simply expensive and inefficient, and as indicated above, cannot be tolerated in applications which employ double-treated foils. Accordingly, until the advent of the present invention, surface contamination has remained a significant and substantial problem to the printed circuit board industry.

SUMMARY OF THE INVENTION

The problems and shortcomings inherent in the prior art procedures and applications discussed above are minimized, if not eliminated entirely, by applying the concepts and principles of the present invention. Thus, the invention provides an effective means for protecting the surfaces of conductive foils throughout those procedures involved in the manufacture of printed circuit boards where surface contamination may potentially create problems and difficulties. Such protection results from the provision of a protected conductive foil assemblage comprising a conductive metallic foil which has two sides. One side of the foil is adapted, generally by chemical treatment, for bonding to a dielectric support during a lamination process involving pressing between plates of a laminating press. The protected assembly further includes a plastic film layer which overlies the other side of the foil in covering, protecting relationship thereto. The plastic film layer is removably united or joined with the foil sufficiently to permit movement and further processing of the foil with the film layer remaining in said covering, protecting relationship relative to the other side of the foil. In accordance with the invention, the plastic film is sufficiently resistant to the temperature and pressure conditions encountered during a lamination process to avoid sticking to a laminating press plate and to retain its removability from the foil after lamination of the foil to a dielectric support.

In accordance with the more specific aspects of the invention, the conductive foil has a peripheral marginal area and the assemblage includes an adhesive, or other means of attachment, disposed between the film layer and the other side of the foil at said marginal area for removably joining the foil and the plastic layer. More particularly, the adhesive may be arranged in a series of spots in the marginal area of the foil.

In another aspect of the invention, the foil and the film layer of the protected assemblage may be coextensive in at least one dimension to present a common edge, and the assemblage may include an adhesive disposed at said common edge for removably joining the foil and plastic layer.

In a particularly preferred commercial aspect of the invention, the protected foil assemblage may include an electrodeposited foil having a matte side and a shiny side. The foil further may be a double-treated conductive metallic foil wherein both the matte side and the shiny side of the foil have been treated for enhanced lamination bonding and peel strength between the surface of the foil and a dielectric support. In accordance with this aspect of the invention, the plastic film is preferably removable after laminating without disturbing the treatment on the shiny side.

In another important aspect of the invention, the plastic film layer may be sufficiently transparent to permit visual inspection of the shiny side of the metallic foil while the film layer is in said covering, protecting relationship thereto. This is a particularly valuable aspect of the invention in connection with double-treated foils so that the treatment on the shiny side of the metallic foil may be visually inspected while the film layer is in said covering, protective relationship thereto.

In accordance with the invention, the assemblage may include a foil and a film layer which are each in the form of an elongated web, and the foil and the film layer webs may be wound up together in the form of a roll. In another aspect of the invention, the foil and the plastic film layer may be configured as sheets which are coextensive in size and the assemblage may include a coextensively sized dielectric support layer which contains a curable laminating resin disposed against the matte side of the foil.

In a preferable and more detailed aspect of the invention, the plastic film layer may have a thickness in the range of from about 0.5 to about 5.0 mils and which preferably is about 2.0 mils or less. In a commercially desirable form the thickness of the plastic film may be about 0.92 mil. Additionally, the plastic film layer should preferably be capable of being exposed to the conditions encountered in a laminating press without releasing chemicals which might contaminate the foil.

In a particularly preferred aspect of the invention, the foil may comprise copper and the plastic film layer may comprise a polyester, preferably a polyester such as a polyethylene terphthalate.

In a different but related aspect of the invention, a procedure is provided for protecting a conductive metallic foil during further handling and use in the preparation of laminates and printed circuit board components therefrom. The procedure comprises the steps of providing a piece of conductive foil having two sides, one side being adapted for bonding to a dielectric support through the use of a lamination process involving pressing between plates of a laminating press. A layer of a plastic film is also provided and the latter is placed in overlying, covering and protecting relationship to the other side of said piece of metallic foil. The layer of film is then removably joined with the metallic foil sufficiently to permit movement and further processing of the foil with the film layer remaining in said covering relationship to said other side of the foil. In accordance with the invention, the plastic film should be sufficiently resistant to the temperature and pressure conditions encountered during the lamination process to avoid sticking to a laminating press plate and to retain its removability from the foil after lamination of the foil to a dielectric support.

In accordance with the procedures of the invention, the plastic film layer and the conductive metallic foil may be releasably, that is removably joined together through the use of an adhesive or other means of attachment disposed between the film layer and the other side of the foil at a marginal area of the latter. An adhesive at the marginal area may be arranged in the form of a series of spots. Alternatively, the foil and the film layer may be coextensive in at least one dimension to present a common edge, and an adhesive may be applied at the common edge to thereby releasably join the foil and film.

Clearly the procedure of the invention is applicable in conjunction with conductive foils generally and in particular with electrodeposited conductive metallic foils and plastic film layers of the sort outlined above. Further the invention is applicable in conjunction with these instances wherein the shiny side of an electrodeposited foil has been treated for enhanced lamination bond strength between the shiny side and a dielectric support; wherein the plastic film is removable after laminating without disturbing such treatment; wherein the plastic film layer is sufficiently transparent to permit visual inspection of the shiny side of the metallic foil and/or the treatment thereon while the film layer remains in its covering, protective relationship to the foil; wherein the foil and the film layer are in the form of elongated webs that are wound up together in the form of a roll; wherein the foil and the plastic film layer are coextensive in size and are laid-up with a coextensively sized dielectric support layer containing a curable laminating resin disposed against the matte side of the foil; wherein the plastic film layer has a thickness in the range from about 0.5 to about 5.0 mils and which preferably is about 2.0 mils or less; wherein the plastic film layer is capable of being exposed to the conditions encountered in the laminating press without releasing chemicals which might contaminate the foil; wherein the foil comprises copper; and/or wherein the plastic film layer comprises a polyester and preferably a polyethylene terphthalate polyester.

In yet another aspect of the invention, the same provides a protected conductive foil laminate which comprises a conductive metallic foil as specified above, a plastic film layer overlying one side of the foil in covering, protecting relationship thereto and a dielectric support. In this aspect of the invention the other side of the foil is bonded to the support through the utilization of a lamination process involving pressing between the plates of a laminating press and the plastic film layer remains removably joined to the foil sufficiently to permit movement and further processing of the laminate with the film layer remaining in said covering, protecting relationship to the foil. In this connection, the plastic film is characterized as having initially been, prior to the lamination process, sufficiently resistant to the temperature and pressure conditions generally encountered during such process to avoid sticking to a laminating press plate and to retain its removability from the foil after lamination of the foil to the dielectric support.

BRIEF DESCRIPTION OF THE DRAWINGS

FIG. 5 is an isometric view of an assemblage embodying the invention similar to FIG. 4 except illustrating an alternative way for removably joining the film and the foil;

FIG. 6 is a perspective exploded view of a protected conductive foil assemblage which embodies the principles and concepts of the invention;

FIG. 7 is a perspective exploded view illustrating another protected conductive foil assemblage which embodies the principles and concepts of the invention;

FIG. 8 is a protected conductive foil laminate which embodies the concepts and principles of the invention and which has been prepared utilizing the assemblage of FIG. 7; and FIG. 9 is a cross-sectional view illustrating the alternative protected conductive foil assemblage of FIG. 5.

DETAILED DESCRIPTION OF THE PREFERRED EMBODIMENTS

Figure 1:
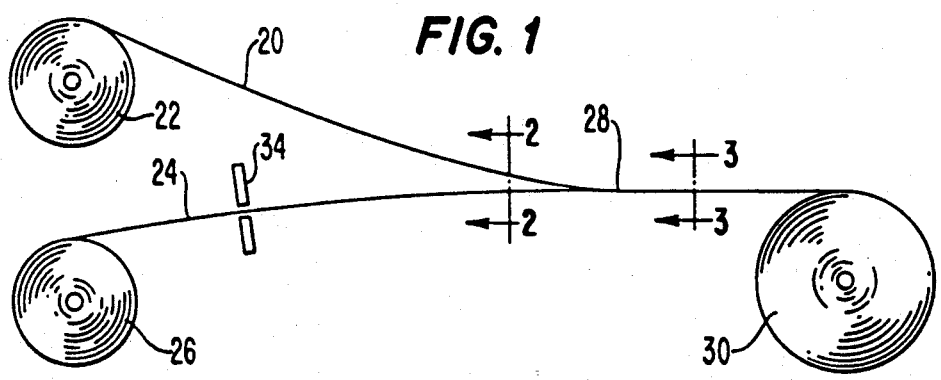
FIG. 1 is a schematic view illustrating a procedure for preparing a protected conductive foil assemblage in accordance with the invention.

As outlined above, the present invention relates to the protection of foil materials which are eventually to be processed to form printed circuits. In this regard, the invention is applicable generally to all kinds of conductive foils and the methodology for preparing and/or producing the foil is not a critical feature of the present invention. For example, the invention may be used to provide protection for electrodeposited foils, for rolled (wrought) foils, for multi-layer foils, for clad foils, etc. Additionally, the specific conductive metal which is utilized for forming the foil is not a feature of the invention, and the invention is applicable generally whether the foil is of copper, nickel, chromium, or other conductive metal. Generally speaking, however, the invention has particular advantages when applied to copper foils prepared using conventional electrodeposition methodology whereby the foil has a smooth shiny side and a rough or matte side. Conventionally such foils are then bonded to dielectric substrates to provide dimensional and structural stability, and in this regard, it is conventional to bond the matte side of the electrodeposited foil to the substrate so that the shiny side of the foil faces outwardly from the laminate.

The specific features of the substrate are also not critical features of the invention and those skilled in the art are familiar with a large variety of such substrates. In a commercial sense, useful dielectric substrates may be prepared by impregnating woven glass reinforcement materials with partially cured resins, usually epoxy resins. Such dielectric substrates are commonly referred to as prepregs.

In preparing laminates, it is conventional for both the prepreg material and an electrodeposited copper foil material to be provided in the form of long webs of material rolled up in rolls. The rolled materials are drawn off the rolls and cut into rectangular sheets. The rectangular sheets are laid-up or assembled in stacks of assemblages. Each assemblage may comprise a prepreg sheet with a sheet of foil on either side thereof, and in each instance, the matte side of the copper foil sheet is positioned adjacent the prepreg so that the shiny sides of the sheets of foil face outwardly on each side of the assemblage.

The assemblages may be subjected to conventional laminating temperatures and pressures between the plates of laminating presses to prepare laminates comprising a sandwich of a sheet of prepreg between sheets of copper foil. Although it is commercially conventional to provide laminates with copper foil on each side of the prepreg, it is also within the contemplation of the present invention that the laminate might be made up of a single sheet of copper foil bonded to one side only of the prepreg.

As indicated above, the prepregs used conventionally in the art generally consist of a woven glass reinforcement fabric impregnated with a partially cured two-stage resin. By application of heat and pressure, the matte side of the copper foil is pressed tightly against the prepreg and the temperature to which the assemblage is subjected activates the resin to cause curing, that is cross linking of the resin and thus tight bonding of the foil to the prepreg dielectric substrate. Generally speaking, the laminating operation will involve pressures in the range of from about 250 to about 750 psi, temperatures in the range of from about 350° to 450° F. and a laminating cycle of from about 40 minutes to about 2 hours. The finished laminate may then be utilized to prepare printed circuit boards.

As set forth above in the description of the prior art, printed circuit board manufacturers seek methodology for producing smaller circuit lines and to otherwise densify the circuitry. As smaller and smaller lines are attempted, the toleration for contamination on the surface of the copper foil decreases rapidly. Such contamination may come from any one of a number of different sources.

In order to densify the circuitry of the printed circuit board, the single substrate laminates described above are married or joined together to present multi-layer printed circuit board structures. Such marriage or joinder is accomplished after the etching of the foil to thereby remove unwanted copper and present defined lines, etc. To then join a laminate with an etched pattern (inner layer) to another laminate with an etched pattern and thus present a multi-layer laminate, the outer surface of the copper inner layer which comprises the shiny side of the foil must be roughened and/or treated to enhance lamination bonding and improve peel strength in the finished structure. It has been traditional to treat the shiny surfaces of the printed copper circuit with a chemical oxide treatment to enhance subsequent bonding. To avoid such treatment, which generally must be accomplished after the printed circuit has been prepared, it has become desirable, at least for some applications, to provide a foil which has been treated to enhance lamination bonding and improve peel strength on both sides thereof. Such foils are known as double-treated foils. And in this regard, it should be pointed out that conductive foils are conventionally treated on the matte side for enhanced lamination bonding and peel strength between the matte side and the prepreg.

Typically the foil treatment involves treatment with a copper/copper oxide bonding material to increase surface area and thus enhance bonding and increase peel strength. The foil may also be treated to provide a thermal barrier, which may be brass, to prevent peel strength from decreasing with temperature. Finally, the foil may be treated with a stabilizer to prevent oxidation of the foil. These treatments are well known and the description thereof is not necessary at this point.

When the foil is double-treated, the treatments for enhanced bonding, improved peel strength and stabilization are applied to both sides of the foil. Through the use of double treated foil, the chemical oxide roughening step may be eliminated. However, the treatment on the shiny side of the double-treated foil is fragile and the treatment can be dislodged if the treated shiny side is not protected. This will result, at least at the points of injury to the treatment, in loss of bond strength, loss of peel strength and increased susceptibility to oxidation.

The present invention provides protection for either treated or untreated foil surfaces by providing an assemblage which includes a plastic film layer that overlies the foil in covering, protecting relationship thereto. In accordance with the concepts and principles of the invention, the plastic film layer is removably (or releasably) joined to the foil sufficiently to permit movement and further processing of the foil with the film layer remaining in its covering, protecting relationship relative to one side of the foil. The plastic film must be sufficiently resistant to the temperature and pressure conditions encountered during a lamination process so as to avoid sticking to the laminating press plate and so as to retain its ability to be removed from the foil after lamination of the foil to the dielectric support. The foil layer may then be etched using conventional methodology to present a printed circuit.

A procedure for preparing a protected conductive foil assemblage which embodies the concepts and principles of the invention is illustrated in FIG. 1. In FIG. 1 a web of conductive metallic foil material 20 is pulled from a roll 22 thereof and a web of plastic film material 24 is pulled from a roll 26 thereof. The foil web 20 pulled from roll 22 and the plastic film web 24 pulled from roll 26 are caused to merge at point 28, and the interleafed assemblage is wound, for storage purposes, onto a roll 30.

Foil 20 may consist of any conductive material that is useful in the preparation of printed circuit board materials. Foil 20 may comprise, for example, conductive copper, or nickel, or chromium, or any other material which may be formed into a foil and then subsequently etched to present the PCB circuitry. Foil 20 may, for example, consist of a wrought foil prepared by rolling or a clad metal foil comprising two or more layers of metal. All such conductive foils may have at least one side that is specially treated for enhanced bonding to a dielectric support and another side that may be exposed to contamination and potential damage during storage, shipment and further processing. The present invention provides protection for such exposed side of the foil. Preferably, however, foil 20 may be an electrodeposited, double-treated, conductive copper foil. Although the thickness of the foil is not critical for purposes of the present invention, typically such foils are available commercially in thicknesses ranging from 3/8 ounce to 10 ounces. In this regard, the required thickness of the foil is generally a function of the eventual commercial application which may be known only to the final printed circuit board fabricator.

With regard to the plastic film layer 24, the same must simply operate to keep contamination off of the outer, otherwise exposed surface of the foil layer. As described above, such outer surface generally comprises either the treated or untreated shiny side of an electrodeposited foil. The plastic film must be capable of protecting the foil and must also be removable after the need for protection no longer exists. Additionally, the film must be sufficiently resistant to the temperature and pressure conditions encountered during lamination so that it does not stick to the laminating press plate and so that it retains its ability to be removed from the foil after the completion of the laminating process. Thus, the film must have sufficient temperature resistance to keep from melting at the temperatures of the laminating process since melting might cause fusing of the plastic material and the resultant sticking of the film to either the plate or the foil. Moreover, the plastic film should preferably be resistant to shrinking and capable of being exposed to the conditions encountered in the laminating press without releasing chemicals which might contaminate the foil.

It is desirable that the plastic film be capable of withstanding exposure to a temperature of about 475° F. for about 2 hours and to a temperature of about 325° F. for about 10 hours, without substantial dimensional change. Such characteristics are determinable using conventional testing methodology. Moreover, the plastic film should generally be free of volatile or organic material which might be released during laminating to contaminate the copper. Preferably, the plastic material utilized to protect the conductive foil should be transparent or translucent after exposure to laminating conditions to facilitate inspection of the underlying foil and/or the treatment thereon while protection of the foil is continued.

For commercial purposes, the preferred film material should be readily available in widths of up to 80 inches. And in this connection, the present commercially available foils are generally available in nominal widths exceeding 40 inches. The plastic layers may have thicknesses ranging from about 0.5 to about 5.0 mils and the thickness preferably should be about 2.0 mils or less to avoid the necessity for enlarged packaging. The film should also be sufficiently flexible and soft at room temperatures to facilitate wrapping of the same around the roll up mandrels used in an interleafing process such as the one illustrated in FIG. 1. Finally, the plastic material should remain useful when subjected to temperatures ranging from about −50° F. to about 500° F. to facilitate storage in winter and utilization under laminating press conditions. Needless to say, many of the foregoing desirable characteristics are variable depending on process and end use parameters. And generally speaking, as will be appreciated by those skilled in the art to which the present invention pertains, empirical procedures will need to be employed in order to determine an optimum material for any given application.

A commercially preferred double-treated copper foil material for use in connection with the invention, is presently available from Gould Inc., Foil Division under the designation TC/TC. Such material is useful in multi-layer printed circuit board applications and is uniformly treated on both its shiny and matte sides with treatments to enhance bond strength, increase peel strength, and provide resistance to thermal, chemical and oxidative degradation.

A preferred plastic film material for protecting the treated shiny side of the TC/TC foil is a polyester film available commercially from DuPont under the designation Mylar 92DB. Such material has a nominal thickness of about 0.92 mils, a density of about 1.395 g/cc, as determined by ASTM Spec D-1505; a tensile strength of 30,000 MD psi, as determined by ASTM Spec D-862, Method A; a tensile elongation of 100 MD %, as determined by ASTM Spec D-882, Method A; a tensile modulus of 547,000 MD psi, as determined by ASTM Spec D-882, Method A; an F-5 of 15,500 MD psi, as determined by ASTM Spec D-882, Method A; a melting point of 255° C., as determined by ASTM Spec D-3417; a shrinkage coefficient at 105° C. of 0.5 MD % and 0.5 TD %, each as determined by ASTM Spec D-1204; a coefficient of thermal expansion of $1.7 \times 10^{-5}$ inch/inch/° C., and Talysurf surface characteristics as determined by Taylor Hobson Talysurf Spec 5 of 0.031 Talysurf RA, 0.264 Talysurf RZ and 38 Talysurf NP. The preferred material is clear and contains only about 0.5 inclusions greater than 1.47 microns ($\mu$) per 100 sq/cm. In this latter regard, it is desirable that the film be sufficiently transparent to permit visual inspection of the underlying shiny side of the foil in compliance with Mil Spec 13949 for Mil Class B materials.

With further reference to FIG. 1, webs 20 and 24 may desirably have widths of about 42 inches. And since a popular commercial width useful in preparing printed circuit board materials is 39 inches, a one and one half inch marginal area is thus presented at each side of the web. This is illustrated in FIGS. 4 and 5 where the marginal areas 32 are illustrated using dashed lines.

Figure 4:
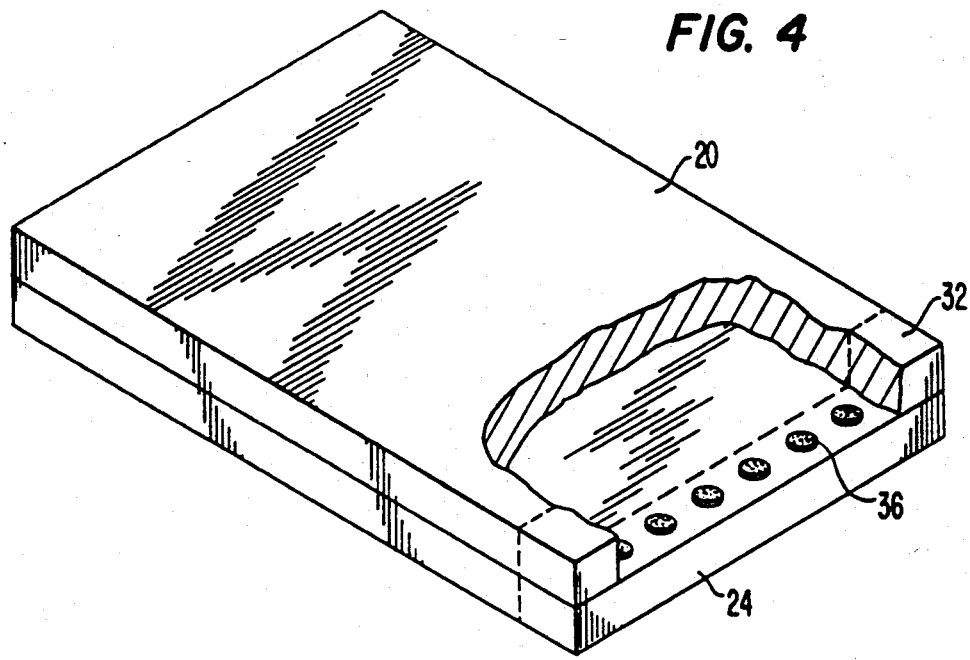
FIG. 4 is an isometric view of an assemblage embodying the invention with a portion broken away so as to illustrate one way for removably joining the foil and the film layer of the invention.

With reference again to FIG. 1, a microdot application machine 34 (shown only schematically in FIG. 1) may be used to apply an adhesive material arranged in a series of spots 36 as shown in FIG. 4. In usual practice, the series of spots 36 will be applied at each side of the interleafed materials so as to removably (releasably) join foil 20 and plastic film layer 24 at the opposite edges thereof.

Figure 2:
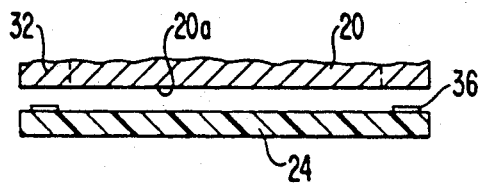
FIG. 2 is a cross-sectional view taken along line 2—2 of FIG. 1.

FIG. 2 illustrates the webs of foil 20 and plastic film 24 in a cross-sectional view taken along the line 2—2 in FIG. 1. As can be seen, the view of FIG. 2 is taken just prior to the point where the webs become merged (interleafed). In FIG. 2, the spots of adhesive 36 and the other components are shown schematically and are not necessarily drawn to scale. As can also be seen, the spots 36 are aligned and arranged to contact foil web 20 in the marginal areas 32 at either side thereof.

Figure 3:
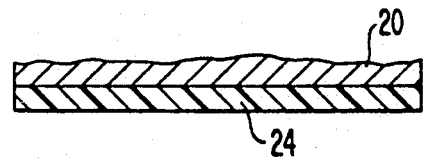
FIG. 3 is a view taken along line 3—3 of FIG. 1 and presenting a cross-sectional view of the protected conductive foil assemblage of the invention.

The webs 20 and 24 merge at point 28 and form an assemblage which is illustrated in FIG. 3. In this regard, it should be noted that FIG. 3 is a cross-sectional view taken along the line 3—3 in FIG. 1 to illustrate the assemblage which comprises the foil 20 and the plastic film 24, the latter now being removably joined to the foil by the adhesive in covering, protecting relationship to the shiny side 20a of the foil.

Alternatively, the foil 20 and plastic film 24 may be removably joined by use of an adhesive material applied at the end of the roll. In this aspect of the invention, the microdot machine 34 is not used and the interleafed foil 20 and plastic film 24 are simply rolled up onto roll 30. The adhesive material is applied at each end of the roll to releasably unite the interleafed film layer and foil layer. This aspect of the invention is illustrated in FIGS. 5 and 9 which show the metallic foil layer 20, the plastic film layer 24 and the adhesive material 38 at each side of the assemblage. Preferably, the adhesive 38 should be sufficiently fluid when applied so that it flows slightly between foil 20 and film 24 at marginal area 32. This is illustrated in FIG. 5 where adhesive 38 is illustrated at the common edge of foil 20 and film 24. The portion of the adhesive which flows between the foil and the plastic film layer is designated by the reference numeral 38a in FIG. 5. Thus, foil 20 and plastic film layer 24 are releasably joined by adhesive 38 so that the foil 20 can be moved and further processed with the film layer 24 remaining in covering, protecting relationship to the shiny side 20a of the foil.

The adhesive material used for either the spots 36 or the end coating 38 may comprise a low viscosity adhesive available commercially from Loctite Corporation under the designation 420. Preferably the adhesive should be used sparingly to avoid penetration beyond the marginal area 32. Alternatively, a hot melt adhesive which flows at about 350° F. may be used for either dot or end application. In any event, the adhesive should be capable of withstanding the conditions in the laminating press so that the foil 20 and film 24 remain releasably joined together by the adhesive after the laminate is formed.

In either case, whether the adhesive is in the form of the spots 36 or in the form of end coating 38, the plastic film layer 24 may be removed from the metallic foil layer 20 simply by removal of the marginal area 32 using conventional cutting and/or slitting procedures which are well known to those involved in the handling and processing of printed circuit board materials.

To utilize the materials wound up on roll 30, the material is unwound from the roll and the web material is cut across the web to present individual sheets of material. In the case of the present invention, when the material is unwound from roll 30 and cut, the resultant product will be a protected conductive foil assemblage 40 as illustrated in FIG. 6. Assemblage 40 is made up of a piece of conductive metallic foil 120 which has a side 120b and a side 120a. As illustrated in FIG. 6, the side 120a is covered by plastic film layer 124 and thus cannot be seen, except for the edge thereof. Side 120b of foil 120 is adapted for bonding to a dielectric support by a lamination process involving pressing between platens of a laminating press. Thus, side 120b has been pretreated for enhanced bond strength, improved peel strength resistance to thermal and chemical degradation and stabilization against oxidation. Plastic film layer 124 overlies side 120a in covering protecting relationship thereto. As explained previously, plastic film layer 124 is removably joined to the foil sufficiently to permit movement and further processing of the foil with the film layer remaining in said covering, protecting relationship to the side 120a of the foil by virtue of the adhesive means such as the spots 36 illustrated in FIG. 4 or the end coating 38 illustrated in FIG. 5.

After assemblage 40 has been cut from the material drawn from roll 30, the assemblage 40 is laid-up with a coextensively sized dielectric support layer 42. Layer 42 preferably may be a prepreg as described above and which contains a curable laminating resin. During the lay-up procedure, the prepreg 42 is simply brought into contact with the side 120b of foil 120. The laid-up materials are thus ready for the lamination process to bond the prepreg 42 to the side 120b of foil 120 while plastic film 124 remains in its covering, protecting relationship relative to side 120a of the foil.

FIG. 6 represents a protected conductive foil assemblage which comprises a prepreg dielectric support layer 42 and a single piece of protected foil. For other applications, however, it may be more desirable to lay-up the prepreg 42 with a protected layer of foil on each side thereof. This is illustrated in FIG. 7, where the prepreg 42 is illustrated as having a foil layer 120 on each side thereof. And in each instance, the foil layer 120 is protected by a corresponding plastic film layer 124. After lay-up and lamination, the assemblage of FIG. 7 takes the form of the laminate 44 shown in FIG. 8. Laminate 44 comprises the prepreg 42, the pieces of metallic foil 120 which have one of their sides bonded to the prepreg 42, and the plastic film layers 124 disposed in covering, protecting relationship relative to the other (outer) sides of the foil layers 120.

In the case of the preferred embodiments described above, the plastic film layer is removably joined with the foil by use of an adhesive material placed in the marginal area of the foil. The foil and film layer may be pulled apart manually or the marginal area may simply be cut off of the assemblage whereby the plastic film is readily separated or removed from the foil. In the broad contemplation of the invention, however, it is recognized that other and different means may be provided for removably joining the plastic film and the foil layer. In this regard, it is to be noted that even the shiny sides of electrodeposited foil layers have certain roughness characteristics. Such roughness should provide sufficient topography to cause a piece of heated plastic pressed thereagainst to cling thereto and thus be releasably joined therewith. The interleafed plastic and foil layers may be pressed together, for example, in the nip of a pressure roll, and sufficient heat provided to cause the plastic to flow just enough to assume the shape of at least the outer portions of the surface peaks of the shiny side of the foil. With such an arrangement, it will be possible to eliminate the need for the marginal areas for placement of the adhesive.

Alternatively, the foil and the plastic layer may be releasably joined by applying sufficient heat to cause the plastic to flow and adhere to foil at marginal areas 32. Such adhesion may preferably be limited to the marginal areas 32 so that upon removal of the marginal areas by cutting or slitting, the foil and the plastic film are readily separable. The heat may be selectively applied to the marginal areas 32 using conventional ultrasonic vibration welding apparatus and techniques. The foil and the plastic layer may also be releasably joined by stitching or sewing the layers together at marginal areas 32.

We claim:

1. A protected conductive foil assemblage comprising:
    a conductive metallic foil having two sides, a shiny side and a matte side, the matte side being adapted for bonding to a dielectric support during a lamination process involving pressing between plates of a laminating press; and
    a plastic film layer overlying the other side of the foil in covering, protecting relationship thereto,
    said plastic film layer being removably joined to the foil sufficiently to permit movement and further processing of the foil with the film layer remaining in said covering, protecting relationship to said other side of the foil,
    said plastic film being sufficiently resistant to the temperature and pressure conditions encountered during a lamination process to avoid sticking to a laminating press plate and to retain its removability from the other side of the foil after lamination of the foil to a dielectric support.

2. A protected foil assemblage as set forth in claim 1, wherein said metallic foil has a peripheral marginal area and said assemblage includes an adhesive disposed between said film layer and said other side at said marginal area for removably joining the foil and the plastic layer.

3. A protected foil assemblage as set forth in claim 2, wherein said adhesive is arranged in a series of spots in said area.

4. A protected film assemblage as set forth in claim 1, wherein said foil and said film layer are coextensive in at least one dimension to present a common edge and said assemblage includes an adhesive disposed at said common edge for releasably joining the foil and plastic layer.

5. A protected film assemblage as set forth in claim 1, wherein said foil is an electrodeposited foil having a matte side and a shiny side, said one side being the matte side and said other side being the shiny side.

6. A protected foil assemblage as set forth in claim 5, wherein said shiny side has been treated for enhanced lamination bond strength between the shiny side and a dielectric support and said plastic film is removable after laminating without disturbing said treatment.

7. A protected foil assemblage as set forth in claim 6, wherein said plastic film layer is sufficiently transparent to permit visual inspection of the treatment on the shiny side of the metallic foil while said film layer is in said covering, protecting relationship thereto.

8. A protected foil assemblage as set forth in claim 1, wherein said plastic film layer is sufficiently transparent to permit visual inspection of the other side of the metallic foil while said film layer is in said covering, protecting relationship thereto.

9. A protected foil assemblage as set forth in claim 1, 3, 4, 5, 6, 7 or 8, wherein said foil and said film layer are in the form of webs and are wound up together in the form of a roll.

10. A protected foil assemblage as set forth in claim 1, 3, 4, 5, 6, 7 or 8, wherein said foil and said plastic film layer are coextensive in size and said assemblage includes a coextensively sized dielectric support layer containing a curable laminating resin disposed against said one side of the foil.

11. A protected foil assemblage as set forth in claim 1, 3, 4, 5, 6, 7 or 8, wherein said plastic film layer has a thickness in the range of from about 0.5 mil to about 5.0 mils.

12. A protected foil assemblage as set forth in claim 11, wherein said plastic film layer has a thickness of about 2.0 mils or less.

13. A protected foil assemblage as set forth in claim 1, 3, 4, 5, 6, 7 or 8, wherein said plastic film layer is capable of being exposed to the conditions encountered in a laminating press without releasing chemicals which contaminate the foil.

14. A protected foil assemblage as set forth in claim 1, 3, 4, 5, 6, 7 or 8, wherein said foil comprises copper.

15. A protected assemblage as set forth in claim 14, wherein said plastic film comprises a polyester.

16. A protected assemblage as set forth in claim 15, wherein said polyester comprises a polyethylene terphthalate.

17. A protected assemblage as set forth in claim 1, 3, 4, 5, 6, 7 or 8, wherein said plastic film layer comprises a polyester.

18. A protected assemblage as set forth in claim 17, wherein said polyester comprises a polyethylene terphthalate.

19. A procedure for protecting an electrodeposited conductive metallic foil during further processing comprising:
   providing a piece of conductive foil having two sides, one side of the foil being adapted for bonding to a dielectric support by a lamination process involving pressing between plates of a laminating press;
   providing a layer of plastic film;
   placing said layer of film over the other side of said piece of metallic foil in covering, protecting relationship to said other side; and
   removably joining said layer of film With the metallic foil sufficiently to permit movement and further processing of the foil with the film layer remaining in said covering, protecting relationship to said other side of the foil,
   said plastic film being sufficiently resistant to the temperature and pressure conditions encountered during a lamination process to avoid sticking to a laminating press plate and to retain its removability from the other side of the foil after lamination of the foil to a dielectric support.

20. A procedure as set forth in claim 19, wherein said piece of metallic foil is provided with a peripheral marginal area and said joining step includes the placement of an adhesive between the layer of film and said other side of the foil at said marginal area.

21. A procedure as set forth in claim 20, wherein said placement of the adhesive comprises arranging the adhesive in a series of spots in said area.

22. A procedure as set forth in claim 19, wherein said piece of foil and said film layer are provided to be coextensive in at least one dimension to present a common edge and said removably joining step comprises placing an adhesive at said common edge.

23. A procedure as set forth in claim 19, wherein said foil is an electrodeposited foil having a matte side and a shiny side, said one side being the matte side and said other side being the shiny side.

24. A procedure as set forth in claim 23, wherein is included the step of treating said shiny side for enhanced lamination bond strength between the shiny side and a dielectric support, said layer of plastic film being removable after laminating without disturbing said treatment.

25. A procedure as set forth in claim 24, wherein said plastic film layer is provided to be sufficiently transparent to permit visual inspection of the treatment on the shiny side of the metallic foil while said film layer is in said covering, protecting relationship thereto.

26. A procedure as set forth in claim 19, wherein said layer of plastic film is provided to be sufficiently transparent to permit visual inspection of the other side of the metallic foil while said film layer is in said covering, protecting relationship thereto.

27. A procedure as set forth in claim 19, 21, 22, 23, 24, 25 or 26, wherein said piece of foil and said film layer are in the form of webs and said procedure includes the step of winding the foil and the film layer up together in the form of a roll.

28. A procedure as set forth in claim 19, 21, 22, 23, 24, 25 or 26, wherein said piece of foil and said plastic film layer are coextensive in size and said procedure includes the step of providing a coextensively sized dielectric support layer containing a curable laminating resin and placing said support layer against said one side of the piece of foil.

29. A procedure as set forth in claim 19, 21, 22, 23, 24, 25 or 26, wherein said plastic film layer has a thickness in the range of from about 0.5 to about 5.0 mils.

30. A procedure as set forth in claim 29, wherein said plastic film has a thickness of about 2.0 mils or less.

31. A procedure as set forth in claim 19, 21, 22, 23, 24, 25 or 26, wherein said plastic film layer is capable of being exposed to the conditions encountered in a laminating press without releasing chemicals which contaminate the foil.

32. A procedure as set forth in claim 19, 21, 22, 23, 24, 25 or 26, wherein said foil is provided as a copper foil.

33. A procedure as set forth in claim 32, wherein said plastic film layer is provided as a polyester film.

34. A metallic foil protecting procedure as set forth in claim 33, wherein said polyester comprises polyethylene terphthalate.

35. A procedure as set forth in claim 19, 21, 22, 23, 24, 25 or 26, wherein said plastic film layer is provided as a polyester film.

36. A procedure as set forth in claim 35, wherein said polyester comprises polyethylene terphthalate.

37. A protected conductive foil laminate comprising:
   a conductive metallic foil having two sides;
   a plastic film layer overlying one side of the foil in covering, protecting relationship thereto; and
   a dielectric support bound to the other side of the foil as a result of having undergone a lamination process involving pressing between plates of a laminating press,
   said plastic film layer being removably joined to the foil sufficiently to permit movement and further processing of the foil with the film layer remaining in said covering, protecting relationship to said other side of the foil,
   said plastic film being characterized as having initially been sufficiently resistant to the temperature and pressure conditions encountered during the lamination process to avoid sticking to a laminating press plate and to retain its removability from the other side of the foil after lamination of the foil to said dielectric support.

38. A protected foil laminate as set forth in claim 37, wherein said foil is an electrodeposited foil having a matte side and a shiny side, said one side being the matte side and said other side being the shiny side.

39. A protected foil laminate as set forth in claim 38, wherein said shiny side has been treated for enhanced lamination bond strength between the shiny side and a second dielectric support and said plastic film is removable without disturbing said treatment.

40. A protected foil laminate as set forth in claim 39, wherein said plastic film layer is sufficiently transparent to permit visual inspection of the shiny side of the metallic foil and the treatment thereon while said film layer is in said covering, protecting relationship thereto.

41. A protected foil laminate as set forth in claim 37, wherein said plastic film layer is sufficiently transparent to permit visual inspection of the other side of the metallic foil while said film layer is in said covering, protecting relationship thereto.

42. A protected foil laminate as set forth in claim 37, 38, 39, 40 or 41, wherein said plastic film layer has a thickness in the range from about 0.5 to about 5.0 mils.

43. A protected foil laminate as set forth in claim 42, wherein said layer has a thickness of about 2.0 mil or less.

44. A protected foil laminate as set forth in claim 37, 38, 39, 40 or 41, wherein said plastic film layer is characterized as having initially been capable of being exposed to the conditions encountered in a laminating press without releasing chemicals which contaminate the foil.

45. A protected foil laminate as set forth in claim 37, 38, 39, 40 or 41, wherein said foil comprises copper.

46. A protected laminate as set forth in claim 45, wherein said plastic film comprises a polyester.

47. A protected laminate as set forth in claim 46, wherein said polyester comprises a polyethylene terphthalate.

48. A protected laminate as set forth in claim 37, 38, 39, 40 or 41, wherein said plastic film comprises a polyester.

49. A protected laminate as set forth in claim 48, wherein said polyester comprises a polyethylene terphthalate.

50. A protected laminate as set forth in claim 37, wherein said foil comprises a wrought foil.

51. A procedure as set forth in claim 19, wherein said foil comprises a wrought foil.

52. A protected conductive foil assemblage as set forth in claim 1, wherein said foil comprises a wrought foil.

53. A protected laminate as set forth in claim 37, wherein said foil comprises nickel.

54. A procedure as set forth in claim 19, wherein said foil comprises nickel.

55. A protected conductive foil assemblage as set forth in claim 1, wherein said foil comprises nickel 56. A protected laminate as set forth in claim 37, wherein said foil comprises a clad foil.

57. A procedure as set forth in claim 19, wherein said foil comprises a clad foil.

58. A protected conductive foil assemblage as set forth in claim 1, wherein said foil comprises a clad foil.

* * * * *